US012249942B2

(12) United States Patent
Liu et al.

(10) Patent No.: US 12,249,942 B2
(45) Date of Patent: Mar. 11, 2025

(54) SYSTEM AND METHOD OF EXTRACTING MOTOR FAULT SIGNATURE USING SPARSITY-DRIVEN JOINT BLIND DECONVOLUTION AND DEMODULATION

(71) Applicant: Mitsubishi Electric Research Laboratories, Inc., Cambridge, MA (US)

(72) Inventors: Dehong Liu, Lexington, MA (US); Varun Kelkar, Champaign, IL (US)

(73) Assignee: Mitsubishi Electric Research Laboratories, Inc., Cambridge, MA (US)

( * ) Notice: Subject to any disclaimer, the term of this patent is extended or adjusted under 35 U.S.C. 154(b) by 170 days.

(21) Appl. No.: 18/126,586

(22) Filed: Mar. 27, 2023

(65) Prior Publication Data

US 2024/0333193 A1 Oct. 3, 2024

(51) Int. Cl.
*H02P 29/024* (2016.01)
*G01R 31/34* (2020.01)

(52) U.S. Cl.
CPC .......... *H02P 29/024* (2013.01); *G01R 31/343* (2013.01)

(58) Field of Classification Search
CPC ..................... H02P 29/024; G01R 31/343
See application file for complete search history.

(56) References Cited

U.S. PATENT DOCUMENTS

| 9,041,325 | B2 * | 5/2015 | Yamazaki | H02P 21/18 |
| | | | | 318/700 |
| 9,261,562 | B2 * | 2/2016 | Lee | H02P 29/0241 |
| 9,618,583 | B2 * | 4/2017 | Liu | G01R 31/50 |
| 10,359,473 | B2 * | 7/2019 | Qiao | F03D 17/00 |
| 10,591,519 | B2 * | 3/2020 | Qiao | F03D 17/00 |
| 2008/0309366 | A1 * | 12/2008 | Zhou | G01M 13/04 |
| | | | | 324/765.01 |
| 2013/0049733 | A1 * | 2/2013 | Neti | F03D 7/0264 |
| | | | | 324/71.1 |

* cited by examiner

*Primary Examiner* — Rina I Duda
(74) *Attorney, Agent, or Firm* — Gene Vinokur

(57) ABSTRACT

A fault detection system is provided to extract fault signature from the time-domain stator current signal of a motor under varying load operations by solving a joint blind deconvolution-demodulation problem, where the stator current of a motor under varying operating conditions is modeled as a stator current of a steady operating condition influenced by the system response vector and a load modulation vector. A proximal alternating linearized minimization-type method is used to solve the joint blind deconvolution-demodulation problem, assuming that the spectrum of the sought-after signal is sparse. Motor fault detection is then performed using the recovered stator current of a steady operating condition.

20 Claims, 9 Drawing Sheets

Algorithm 1 Proposed algorithm for blind signal recovery

1: Input: $\mathbf{y} \leftarrow \mathbf{y}_{bf}$ (MV beamformed measurements)
2: Set $k = 0$ and initialize $\mathbf{x}_0 = \mathbf{F}^{-1}(X_{init}[f])$ according to (14).
3: Compute $\hat{\alpha}$, and $\hat{\beta}$, initialize $\mathbf{m}_0 = \mathbf{m}_{init} = \mathbf{F}^{-1}(\tilde{M}_{\alpha,\beta}[f])$, as described in (16)
4: while $\mathbf{x}_k$ is not converged do
5: $\quad \angle H_{k+1}[f] \leftarrow \angle \frac{Y[f](M_k \otimes X_k)^*[f]}{\mathcal{H}_{\alpha,\beta}[f] \|(M_k \otimes X_k)[f]\|^2 + \epsilon} , \; |H_{k+1}| = \mathcal{H}_{\alpha,\beta}$
6: $\quad \mathbf{h}_{k+1} = \mathbf{F}^{-1}(H_{k+1}[f])$
7: $\quad \mathbf{x}_k \leftarrow \mathbf{x}_k - \eta_x \nabla_{\mathbf{x}_k} \|\mathbf{y} - \mathbf{h}_{k+1} \otimes (\mathbf{m}_k \odot \mathbf{x}_k)\|_2^2$
8: $\quad \mathbf{x}_{k+1} \leftarrow \text{prox}[\lambda_x \|\sigma \odot \mathbf{F}\mathbf{x}_k\|_1](\mathbf{x}_k)$
9: $\quad \mathbf{m}_{k+1} \leftarrow \mathbf{m}_k - \eta_m \nabla_{\mathbf{m}_k} \|\mathbf{y} - \mathbf{h}_{k+1} \otimes (\mathbf{m}_k \odot \mathbf{x}_{k+1})\|_2^2$
10: $\quad k \leftarrow k + 1$
11: end while
12: Output: $\hat{\mathbf{s}} = \mathbf{h}_k \otimes \mathbf{x}_k$.

FIG. 3

SYSTEM AND METHOD OF EXTRACTING MOTOR FAULT SIGNATURE USING SPARSITY-DRIVEN JOINT BLIND DECONVOLUTION AND DEMODULATION

FIELD OF THE INVENTION

The present invention is related to a system for extracting fault signatures of motors operating under varying speed or varying load conditions, based on motor current signature analysis.

BACKGROUND OF THE INVENTION

Motor faults such as bearing fault, eccentricity fault, and broken-bar fault, etc., cause asymmetric rotating flux in the air gap between the stator and the rotor, and consequently induce extra frequency components in the stator current. Therefore, when there exists a motor fault, the frequency spectrum of the motor current includes not only the operating frequency component, but also the fault signature frequency component. Depending on the fault type, different faults exhibit different signatures. For instance, for eccentricity fault, the frequency components can be expressed as $f_s \pm m f_r$, where $f_s$ is the frequency of the power supply, $f_r$ is a rotor frequency related to the rotational speed, and m=0, 1, 2, . . . .

Motor current signature analysis (MCSA), which aims to extract fault signatures in the frequency domain, has been widely used in motor fault detection. In the past decades, various MCSA-based methods have been developed to detection different types of faults in motors. MCSA-based methods work well in general for motors operating at steady status with a constant load and a constant rotating speed. However, when the motor under test is operating at varying conditions such as a fluctuating load, the motor current magnitude will vary adaptively to provide enough torque to drive the load. In such a situation, the fault signature, whose magnitude is generally much smaller than the operating frequency component, may be corrupted by the distorted frequency spectrum of the motor current due to varying operations or submerged by noise and other systematic perturbations. This issue becomes more evident when the fault is developing at its early stage. Therefore, it is desirable to develop advanced methods to recover the fault signature from varying motor current. Recent studies have considered specific models of load variations, such as phase modulation due to a sinusoidally varying load. For conditions when the load is varying with a specific pattern, time-frequency analysis methods may be used by analyzing multiple time-domain segments. However, time-frequency analysis methods suffer from an inherent tradeoff between time and frequency resolution. Recently, minimum variance (MV) beamforming-based denoising approach is introduced in this motor fault detection area to extract small fault signature under varying load conditions. MV beamforming-based denoising is good at removing random noise, but not capable of removing structured load fluctuations. Accordingly, there is a need to develop a novel method and a novel system, which are capable of extracting motor fault signatures while removing the structured load fluctuations.

SUMMARY OF THE INVENTION

In this work, we propose a sparsity-driven method to extract fault signature from the time-domain stator current signal of a motor under varying load operations by solving a joint blind deconvolution and demodulation problem. The main contribution of our paper lies in the following three aspects. First, we build a physical model of the stator current, combining a modulation of the signal with an unknown load signal and a convolution with an unknown filter. Second, we cast the problem of recovering the steady-state stator signal with fault signatures as a joint deconvolution-demodulation optimization problem with proper assumptions. Third, we develop a proximal alternating linearized minimization-type method to solve the problem, assuming that the spectrum of the sought-after signal is sparse. We demonstrate the utility of our approach on signals collected from a real two-pole induction motor under varying load conditions.

Some embodiments of the present invention are based on recognition that a fault detection system is provided for detecting faults of an induction motor operating at varying operating conditions indicative of varying load conditions, varying speed conditions or combination thereof. The fault detection system includes a sensor device connected to a power cable of the induction motor, wherein the sensor device is configured to measure a stator current of the induction motor under the varying operating conditions via the power cable; a memory configured to store a computer-implemented fault detection method; a signal processor configured to perform steps of the computer-implemented fault detection method, wherein the steps comprise: forming a stator current vector by sampling the measured stator current using on a sampling frequency according to time sequences; reducing noise of the stator current vector using a minimum-variance (MV) beam forming method; formulating a joint blind deconvolution-demodulation optimization problem based on the stator current vector of a steady operating condition, a response vector of the induction motor, a modulation vector of varying operating conditions, and a noise vector to satisfy the measured stator current vector with reduced noise; estimating the stator current vector of the steady operating condition, the response vector of the induction motor, the modulation vector of the varying operating conditions, and the noise vector by solving the joint blind deconvolution-demodulation optimization problem; extracting fault signatures from a clean stator current estimate vector, wherein the clean stator current estimate vector is generated by use of the estimated response vector and the estimated stator current vector; producing a control command to a controller of the induction motor if at least one of the fault signatures is greater than a threshold and controlling the induction motor by transmitting the control command that causes the controller to reduce an operation speed of the induction motor to a safety level, otherwise producing and transmitting a normal command indicative of the normal operations of the induction motor to the controller.

According to some embodiments of the present invention, a computer-implemented method is provided for detecting faults of an induction motor operating at varying operating conditions indicative of varying load conditions, varying speed conditions or combination thereof. The method includes measuring a stator current of the induction motor under the varying operating conditions via a current sensor connected to a power cable of the induction motor; forming a stator current vector by sampling the measured stator current using on a sampling frequency according to time sequences; reducing noise of the stator current vector using a minimum-variance (MV) beam forming method; formulating a joint blind deconvolution-demodulation optimization problem based on the stator current vector of a steady operating condition, a response vector of the induction motor, a modulation vector of varying operating conditions, and a noise vector to satisfy the measured stator current vector with reduced noise; estimating the stator current vector of the steady operating condition, the response vector of the induction motor, the modulation vector of the varying operating conditions, and the noise vector by solving the joint blind deconvolution-demodulation optimization problem; extracting fault signatures from a clean stator current estimate vector, wherein the clean stator current estimate vector is generated by use of the estimated response vector and the estimated stator current vector; producing a control command to a controller of the induction motor if at least one of the fault signatures is greater than a threshold and controlling the induction motor by transmitting the control command that causes the controller to reduce an operation speed of the induction motor to a safety level, otherwise producing and transmitting a normal command indicative of the normal operations of the induction motor to the controller.

BRIEF DESCRIPTION OF THE DRAWING

The accompanying drawings, which are included to provide a further understanding of the invention, illustrate embodiments of the invention and together with the description serve to explain the principle of the invention. The drawings shown are not necessarily to scale, with emphasis instead generally being placed upon illustrating the principles of the presently disclosed embodiments.

FIG. 3 is a detailed description of the spectrum analysis of stator current measured from an induction machine operating at varying conditions using a blind deconvolution-decomposition method, according to embodiments of the present invention;

DETAILED DESCRIPTION OF THE PREFERRED EMBODIMENTS

Figure 1A:
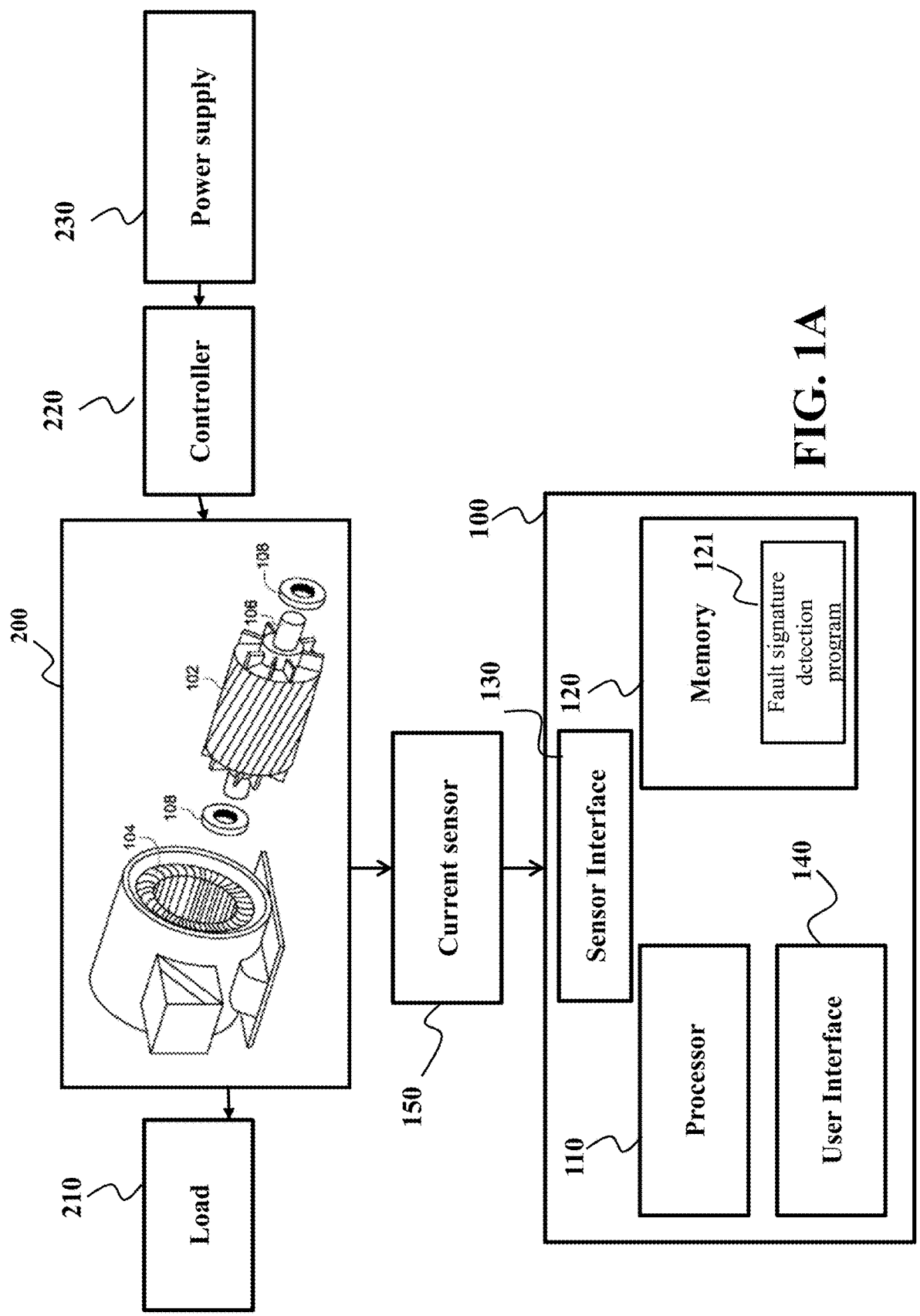
FIG. 1A is a schematic of a system for onsite operating and monitoring an induction motor according to one embodiment of an invention.

Various embodiments of the present invention are described hereafter with reference to the figures. It would be noted that the figures are not drawn to scale elements of similar structures or functions are represented by like reference numerals throughout the figures. It should be also noted that the figures are only intended to facilitate the description of specific embodiments of the invention. They are not intended as an exhaustive description of the invention or as a limitation on the scope of the invention. In addition, an aspect described in conjunction with a particular embodiment of the invention is not necessarily limited to that embodiment and can be practiced in any other embodiments of the invention.

FIG. 1A is a schematic of a fault detection system 100 for controlling and monitoring an induction motor according to one embodiment of an invention.

The induction motor (system) 200 includes a rotor assembly 102, a stator assembly 104, a main shaft 106, and two main bearings 108. In this example, the induction motor 200 is a squirrel-cage induction motor. The induction motor 200 is connected to a load apparatus 210, which is mounted on the shaft of the rotor, such as a power fan or a transmission belt.

The controller 220 is powered by power supply 230 and can be used for monitoring and controlling the operation of the induction motor 200 in response to various inputs in accordance with embodiments of the present invention. For example, the controller 220 connected to the induction motor 200 can control the speed of the induction motor based on inputs received from the fault detection system 100 configured to acquire data pertaining to operating conditions of the induction motor 200 from the current sensor 150. According to certain embodiments, the electrical signal of the current sensor 150 can be current from one or more of the multiple phases of the induction motor. More specifically, in the case of the induction motor is a 3-phase induction motor, the current sensor senses the current data from the three phases of the 3-phase induction motor. While certain embodiments of the present invention will be described with respect to a multi-phase induction motors, other embodiments of the present invention can be applied to other multi-phase electromechanical machines.

Some embodiments of the present invention describe a system for fault detection in an electric machine, such as the induction motor 200. The system configured for detection includes a fault-detection system 100 for detecting the presence of a faulty condition of a rotor 102, including eccentricity fault, within the induction motor assembly. In one embodiment, the fault detection system 100 is implemented as a sub-system of the controller 220. In alternative embodiment, the fault-detection system 100 is implemented using a separate processor. The fault-detection system 100 may be a hardware circuit module that is operatively connected to the controller 220. In some implementations the fault-detection system 100 and the controller 220 can share the information. For example, the fault detection system 100 can reuse sensor data used by the controller to control the operation of the induction motor.

Further, the fault-detection system 100 includes a processor 110, a memory 120, a fault detection program 121 stored in the memory 120 when the instructions of the program are performed by the processor 110. The fault-detection system 100 further includes a sensor interface 130 configured to acquire signals from the current sensor 150. The interface 130 includes A/D (analog/digital) and A/D (analog/digital) coverts to perform data communication with the processor 110, the memory 120, the fault detection program, a user interface 140 and the current sensor 150. The processor 110 may be multiple processors, and the memory 120 may be a memory module that includes multiple memories. The processor 110 is configured to execute the fault signature detection program 121 by receiving the signals of stator and rotor currents of the induction motor 200 via the current sensor 150 connected to the fault-detection system 100 using the sensor interface 130.

The user interface 140 is configured to connect to a keyboard and a display unit configured indicate the normal/fault status information of the induction motor 200 in response to the output of the fault-detection module 200.

Figure 1B:
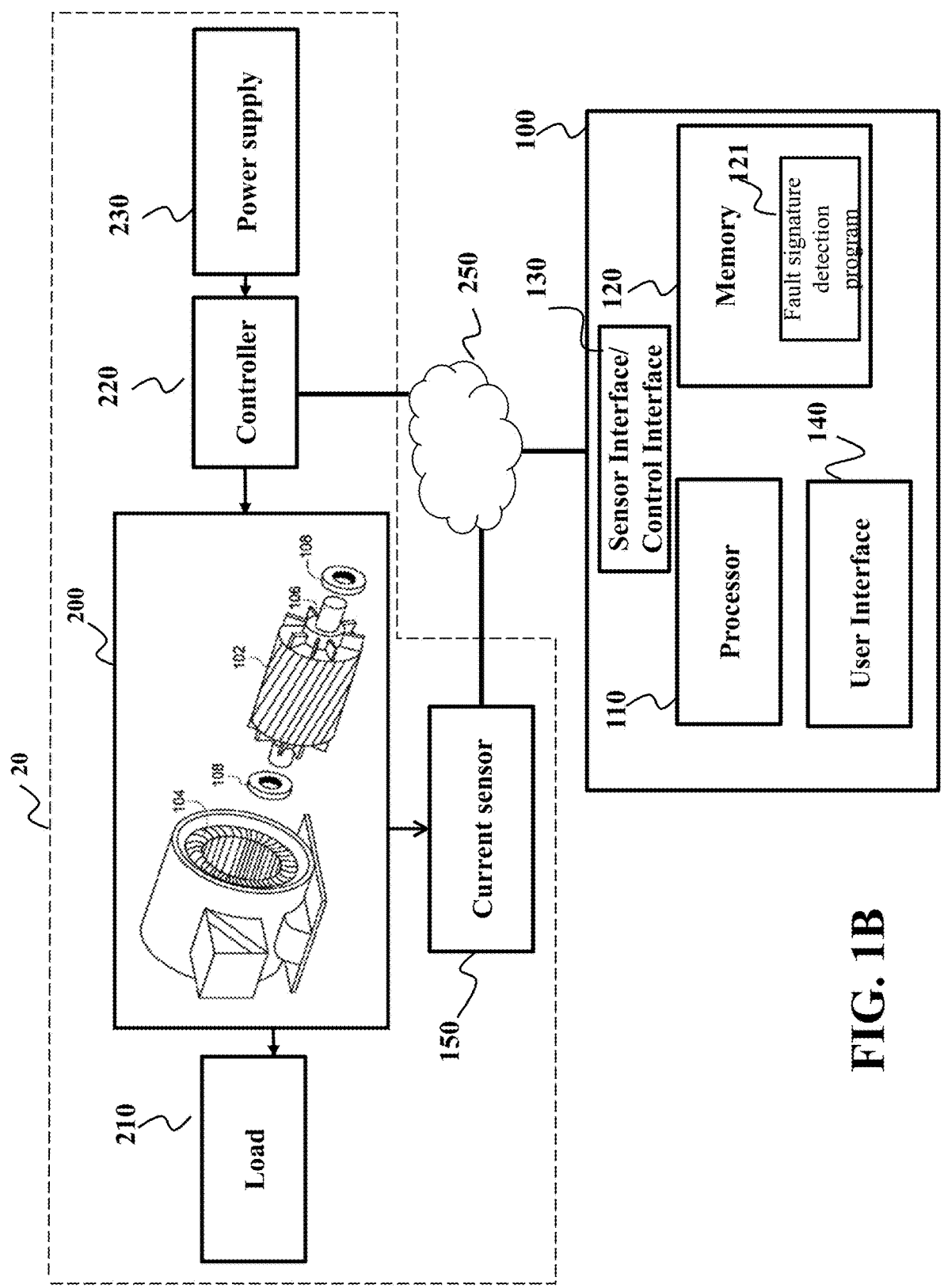
FIG. 1B is a schematic of a system for online (over-the-cloud) operating and monitoring an induction motor according to one embodiment of an invention.

FIG. 1B is a schematic of a fault detection system operated by a user (operator) via a network 250 for controlling and monitoring an induction motor according to one embodiment of an invention. In this case, the fault-detection system 100 may be included in an operating system of induction motors located at the site of the user/operator or the outside of the site of the operator. When the fault-detection system 100 determines that a severe fault is caused in the induction machine 200 based on the sensor signal of the current sensor 150 via the network (communication network) 250 during the operation of the induction machine (induction motor) 200, the fault-detection system 100 can transmit a control signal indicative of the level of a fault level caused in the induction machine 200 to the controller 220 via the network 250 such that the controller 220 reduces an operation speed of the induction machine to a safety level or even stops the induction machine. For instance, the controller 220 slows down or stops operating the induction machine 200 according to the control signal indicating the fault level of the determined fault by the fault-detection system 100 based on a preprogrammed algorithm (not shown in the figure) stored in the memory of the controller 200. The control signal can be indicative of the operation status of the induction machine 200. For instance, the control signal can be indicative of the normal operations of the induction machine 200 or the level of a fault level caused in the induction machine 200. The controller 220 includes a display monitor system (not shown) and a user interface (not shown) configured to input a control command to the induction machine 200 such that an operator can control the operations of the induction machine 200 by inputting the control command that causes the induction machine 200 slow down or stop the operations of the induction machine 200. Further, when the controller 220 receives the control signal from the fault-detection system 100, the display monitor system having a monitor and a graphical user interface (GUI) can display the status of the operations of the induction machine 200 on a monitor of the display monitor system, in which the status of the operations indicates the normal operations of the induction machine 200 or the level of the fault detected by the fault-detection system 100.

In some cases, the calibrations of the current sensor 150 can be performed based on the sensor calibration program (not shown in the figure) stored in the memory of fault-detection system 100. In some cases, the network 250 may be an optical fiber network, a wireless network, an internet network, or a data communication network consisting of at least two combinations among the optical fiber network, the wireless network, and the internet network.

This configuration can be a maintenance system managed by a user/client, who operates the induction machine system 20 separately located from the site of the induction machine. For instance, this system configuration can be used for a power generating system operated by a user, and a train system for controlling the induction motors driving the trains. In some cases, when the fault-detection system 100 detects a site of the induction machine is separated from a site of the fault detection system, the data communication between the site of the induction machine and the site of the fault detection system is performed via a network. The network 250 may be an optical fiber network, a wireless network, an internet network, or a data communication network consisting of at least two combinations among the optical fiber network, the wireless network, and the internet network.

Further, the fault detection system is included as part of a maintenance system of a user. When the determined fault level (for example eccentricity) of the induction machine is equal to or greater than a critical threshold level, the fault detection system produces a control command and transmits the control signal of the control command to the controller 220 of the induction machine 200 via a network 250 using the sensor interface/control interface 130 to slow down or stop operating the induction machine 200.

Figure 2:
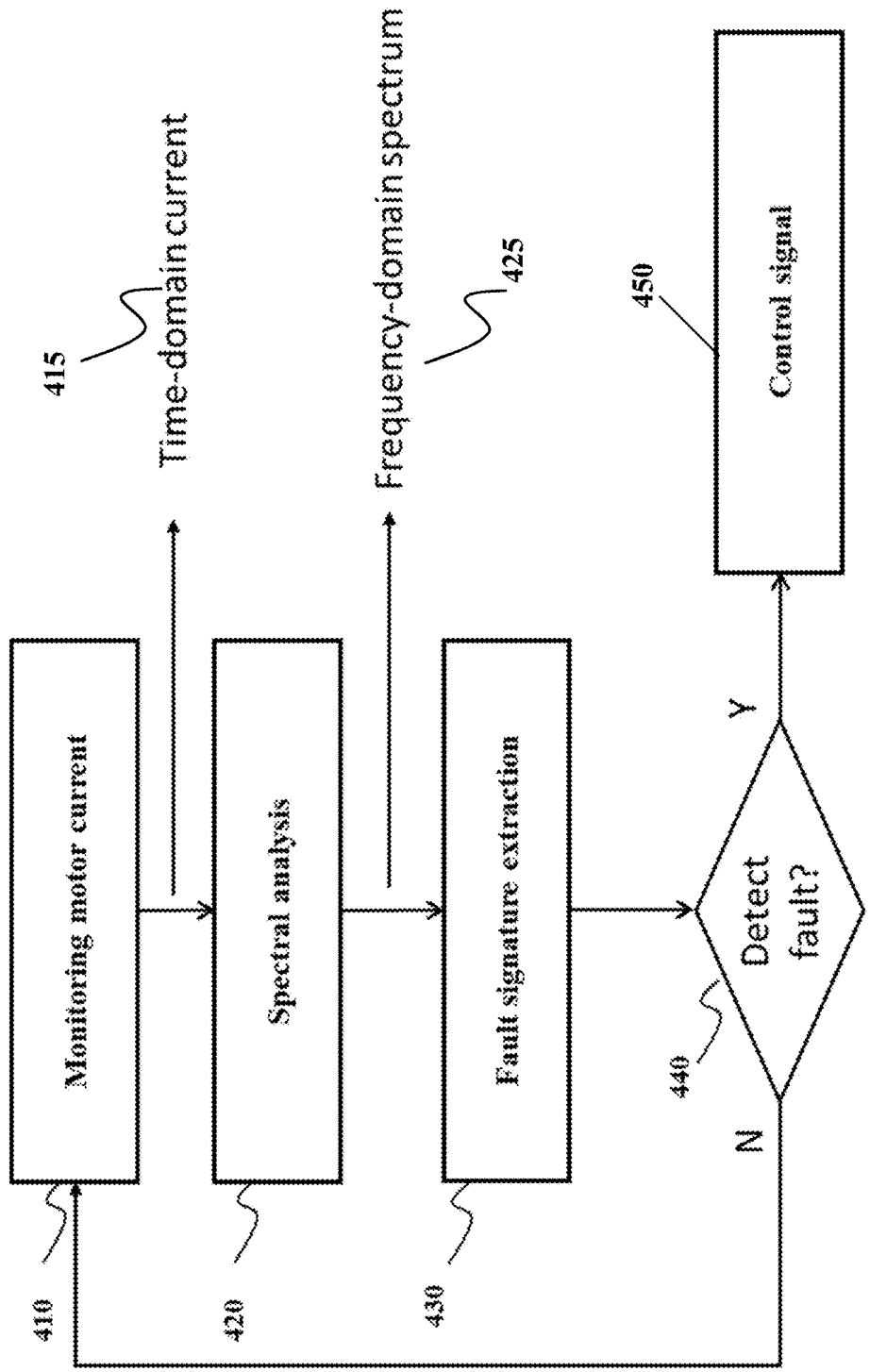
FIG. 2 is a block diagram of the fault detection process for an induction machine operating at varying operating conditions, according to embodiments of the present invention.

FIG. 2 is a block diagram of the fault detection process for an induction machine operating at varying operating conditions according to embodiments of the present invention. When the motor 200 is running with a varying load 210, the motor current is monitored using a sensor interface 130 by constantly measuring the stator current using the current sensor 150. Through the monitoring motor current process 410, a time-domain current 415 is measured and saved at a certain time interval for spectral analysis 420 using the proposed blind deconvolution-decomposition spectrum analysis method, resulting a frequency-domain spectrum 425 corresponding to a constant operating condition, with the varying load influence removed. Based on the frequency-domain spectrum, fault signature at certain frequency, for example, frequency components at approximately 30 Hz and approximately 90 Hz for eccentricity fault when the operating frequency is 60 Hz, is extracted, where the fault signature magnitude is used to if there is a fault or not 440. If the fault component of the fault signature magnitude is greater than a certain value (threshold amplitude), for example, approximately 1/100 (−40 dB) of the operating frequency component at 60 Hz, the fault detection system determines that a fault is detected, and a control command (control signal) 450 is sent to the control circuit of the controller of the induction motor to slow down or stop the motor for safety purpose. Further, the control command can indicate different fault types, different fault levels and fault positions based on the detected frequency components and the signal magnitude of the fault signature. For example, if the current intensity on bearing fault signature frequency increases, a bearing fault is detected. Otherwise, the fault detection system keeps monitoring the stator current. In some cases, when the fault detection system does not detect a fault based on the threshold, the fault detection system produces and transmits a normal command indicative of the normal operations of the induction motor to the display of the controller, causing the GUI of the display to show a sign/text indicating a normal operation status on the display.

Without loss of generality, we consider a three-phase motor operating at an open-loop condition, driving a varying load 210. For time t∈R, let $i_s(t)$ and $i_r(t)$ be the time-domain stator and rotor currents respectively, and $u_s(t)$ and $u_r(t)$ denote the stator and the rotor voltages respectively, all in the space vector representation. The relationships between $i_s$, $i_r$, $u_s$, and $u_r$ is given by $$u = Zi + L\frac{di}{dt} \qquad (1)$$

where $i(t)=[i_s(t)\ i_r(t)]^T$, $u(t)=[u_s(t)\ u_r(t)]^T$, and $$Z = \begin{bmatrix} R_s & 0 \\ -j\Omega M & R_r - j\Omega L_r \end{bmatrix} \text{ and } L = \begin{bmatrix} L_s & M \\ M & L_r \end{bmatrix}$$

are impedance and inductance matrices respectively with parameters defined as follows. $R_s$ and $R_r$ represent stator and rotor resistance respectively, $L_s$, $L_r$, and M denote the stator, rotor, and mutual inductance respectively, and $\Omega$ is the mechanical angular velocity of the rotor. In the frequency domain, motor currents can be formulated according to (1) as $$\begin{bmatrix} I_s(\omega) \\ I_r(\omega) \end{bmatrix} = (Z + j\omega L)^{-1} \begin{bmatrix} U_s(\omega) \\ U_r(\omega) \end{bmatrix}, \qquad (2)$$

where $\omega = 2\pi f$ is the angular frequency. Therefore, the transfer function corresponding to the stator and rotor currents can be expressed in the frequency domain as $$H(\omega) = \frac{I_s(\omega)}{I_r(\omega)} = \frac{a + jb\omega}{c + jd\omega}, \qquad (3)$$

where a, b, c, and d are complex numbers related to the motor parameters and its rotational angular speed $\Omega$. When the motor is operating at a steady state, meaning the angular speed $\Omega$ is a constant, $H(\omega)$ is characterized by motor parameters, which could be different for different motors. When the motor is operating at a varying speed or a transient state, $H(\omega)$ is also related to the rotational speed $\Omega$.

On the other hand, since the load is varying slowly, we assume that the motor can track the load change and provide enough electromagnetic torque to drive the load. Let $\tau(t)$ be the electromagnetic torque as a function of time, $i_{ss}(t)$ be the steady-state stator current under constant load in noiseless conditions. The electromagnetic torque can be approximated by either the stator current or the rotor current, or combination of the stator current and the rotor current using space vectors as $$\tau(t) = \kappa i_s(t) * i_r(t) \approx \kappa i_{ss}(t) * i_r(t), \qquad (4)$$

where $\kappa$ is a proportionality constant, the superscript * represents the Hermitian transpose. This implies $$i_r(t) = \frac{\tau(t)}{\|\kappa i_{ss}(t)\|^2} i_{ss}(t) \triangleq m(t)x(t), \qquad (5)$$

where $$m(t) = \frac{\tau(t)}{\|\kappa i_{ss}(t)\|^2}$$

is a modulation signal related to the electromagnetic torque (or approximate load) and $x(t)$ is the underlying steady-state stator current to be explored. Combining (3) and (5), we have $$i_s(t) = h(t) \otimes i_r(t) = h(t) \otimes [m(t)x(t)], \qquad (6)$$

where $\otimes$ represents the convolution operation.

Let $y(t)$ denote the measured stator current with additive noise. Therefore, the measured stator current with varying operating conditions can be modeled as $$y(t) = h(t) \otimes [m(t)x(t)] + n(t), \qquad (7)$$

where $n(t)$ represents the measured noise.

Figure 4:
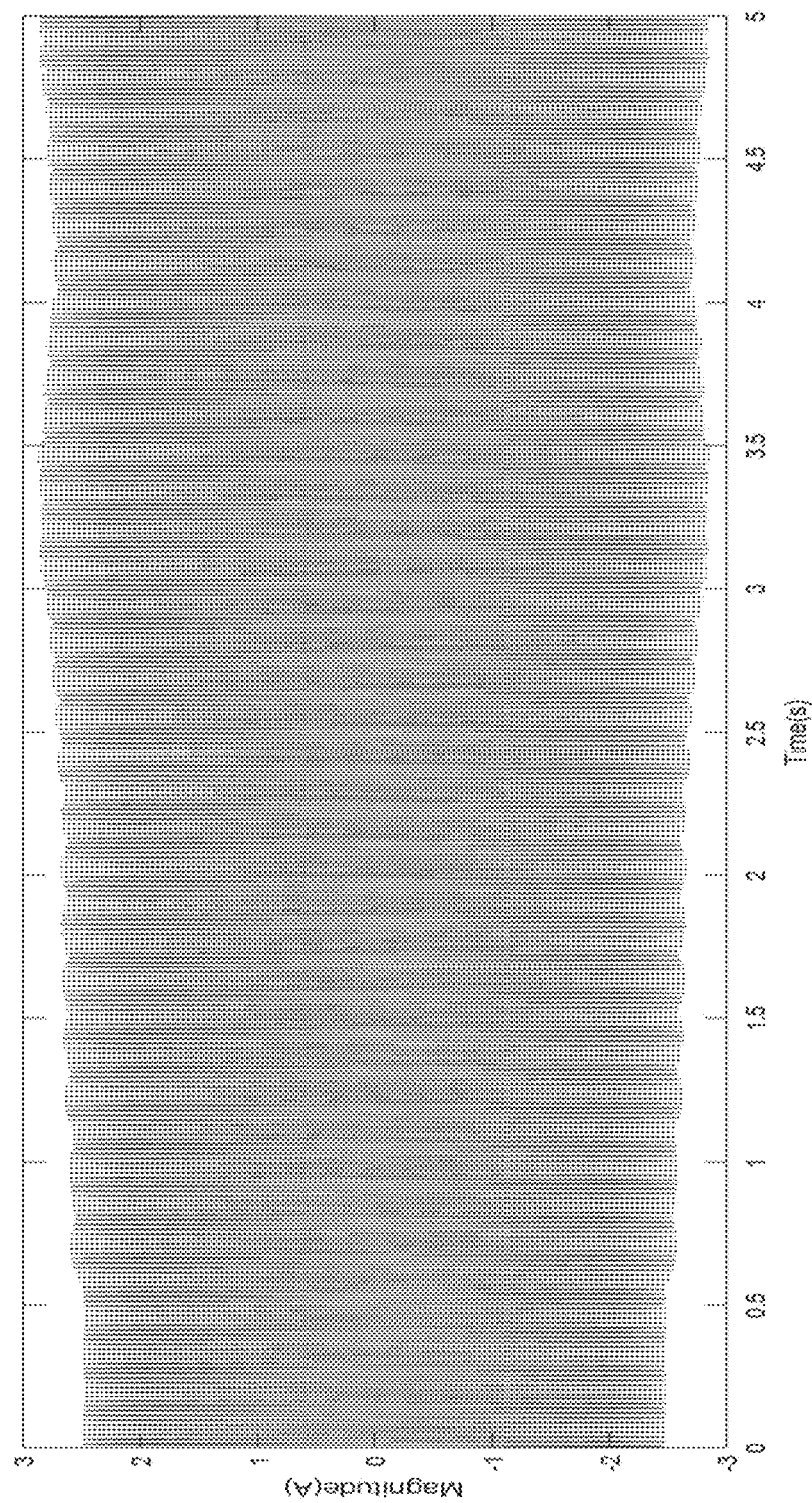
FIG. 4 is an exemplar plot of stator current in the time-domain of an induction machine operating at varying operating conditions according to embodiments of the present invention.

FIG. 4 is an exemplar plot of stator current in the time-domain of an induction machine operating at varying operating conditions. When the load $m(t)$ is varying, the amplitude of $y(t)$ is not a constant, but varying with load. Equivalently we have the stator current model in frequency domain $$Y(\omega) = H(\omega)[M(\omega) \otimes X(\omega)] + N(\omega). \qquad (8)$$

To rewrite our measurement model in discrete-time (DT) domain, we define $s=[s[t_0], s[t_1], \ldots, s[t_{N-1}]]^T$ as a vector of samplings of a time-domain signal $s(t)$ with sampling frequency $F_s$, where $$t \in \left\{ t_n = \frac{n}{F_s},\ n = 0, \ldots, N-1 \right\}.$$

Let $S[f]$ denote the frequency-domain vector of the discrete-time Fourier transform (DTFT) of s, i.e. $S[f]=Fs$, where $F \in C^{N \times N}$ denotes the DTFT operation.

Following the above notation, we use x, y, m, h, n $\in C^N$ to represent the vectors of samplings from $x(t, y(t), m(t), h(t),$ and $n(t)$ respectively. Thus, the time-domain signal model described in (7) can be rewritten as follows:

$$y = h \otimes (m \odot x) + n, \qquad (9)$$

where $\odot$ represents the element-wise product of two vectors.

Obtaining an estimate of x, m, and h from y amounts to solving a joint blind deconvolution-demodulation optimization problem. This is an ill-posed inverse problem and requires prior knowledge about the nature of x, m, and h. Based on the physical model of the stator current in the presence of load, the following assumptions about the nature of x, m, and h are made.

First, we know that x contains a strong operating frequency signal, its harmonics, and other periodic signals that correspond to the motor fault. In the frequency domain, x is typically of the form $$X[f] = \sum_{i=1}^{n_S} A_i \, \delta[f - f_i], \quad (10)$$

where $A_i$ is the amplitude of frequency component presented at $f_i$.

Therefore, we assume that Fx is a sparse vector.

Second, we assume that the random load is slowly varying in time. This translates to the assumption that m(t) is band limited with half-bandwidth $f_m$, i.e., $$supp \, (m) = [-f_m; f_m]. \quad (11)$$

Lastly, based on the aforementioned nature of the motor impulse response, we assume that the form of the magnitude frequency response h(t) is of the form $$|H[f]| = H_{\alpha,\beta}[f] = \sqrt{\frac{1 + 4\pi\alpha_1\beta_1 f + 4\pi^2\beta_1^2 f^2}{1 + 4\pi\alpha_2\beta_2 f + 4\pi^2\beta_2^2 f^2}}, \quad (12)$$

where $\alpha=[\alpha_1 \, \alpha_2]_T$, $\beta=[\beta_1 \, \beta_2]^T$, related to a, b, c, and d in (3), $\alpha, \beta \in R^2$ $|\alpha_1|$, $|\alpha_2|<1$ (i.e. $\|\alpha\|_\infty < 1$), and the phase $\angle H[f]$ needs to be estimated from the measured data.

Based on the prior assumptions described above, the problem of MCSA fault detection under varying operating conditions can be cast as the following generalized optimization problem to jointly estimate x, m, and h, $$\{\hat{h}, \hat{m}, \hat{x}\} = \mathrm{argmin}_{\{h,m,x\}} \, L(h, m, x) + \lambda_x \psi_x(x) \quad (13)$$

$$= \mathrm{argmin}_{\{h,m,x\}} \|y - h \otimes (m \odot x)\|_2^2 + \lambda_x \|\sigma \odot Fx\|_1$$

s.t. $supp \, (m) = [-f_m; f_m];$ $|H[f]| = H_{\alpha,\beta}[f],$ where $\psi_x(x) = \|\sigma \odot Fx\|_1$ is a weighted $l_1$ penalty with weights a to promote sparsity in Fx. Although a similar optimization problem arises in blind demodulation, the problem at hand presents significant challenges unique to the physical measurement system. First, the signal x is affected by both an unknown modulating signal and an unknown filter. Second, x may contain very weak periodic signatures of the motor fault, which are typically 40 dB to 60 dB lower in power than the main operating power frequency component at $f_s$. Moreover, similar to blind deconvolution or demodulation, this is a non-convex optimization problem. Therefore, to find a suitable solution, a good initialization of x, m, and h is necessary. Our approach to solving this problem is inspired by the proximal alternating linearized minimization (PALM) framework, with careful initialization heuristics and regularization that are described below. FIG. 3 is a detailed description of the spectrum analysis of stator current measured from an induction machine operating at varying conditions using a blind deconvolution-decomposition method according to some embodiments of the present invention.

In order to make our approach robust to noise, we preprocess the measurements using denoising via minimum-variance (MV) beamforming. In the minimum-variance beam-forming method, the time-domain stator current under test is segmented into multiple overlapped time sequences with a fixed time shift. Each sequence is treated as an independent measurement of a virtual current sensor. Since the time difference between adjacent sequences is identical, these virtual sensors form a linear virtual sensor array. The spectrum analysis problem is then converted to a beam-forming problem of a linear array in the frequency domain. The minimum variance beam-forming method minimizes the noise variance of spectrum at each frequency with respect to weights on the frequency component of different sequences. Therefore, it is effective at reducing the noise in the measured current signal, but unable to remove structured artifacts due to the varying load.

Next, since it is known that x is sparse in the frequency domain and contains the fundamental frequency and harmonics of the operating frequency $f_s$, we initialize x as a linear combination of 2 $n_s$ harmonics of $f_s$, with the amplitude of each harmonic being equal to the amplitude of that harmonic in the measured data.

$$X_{init}[f] = \sum_{k=-n_s}^{n_s} Y[f] \cdot \delta[f - f_{s,k}], \quad (14)$$

where $f_{s,k}$ is the $k^{th}$ harmonic frequency.

Next, we initialize $\angle H[f]=0$, and $|H[f]|=H_{\alpha,\beta}[f]$, where $\alpha$ and $\beta$ are to be estimated from the measured data. Considering that X[f] is a sparse weighted sum of delta functions, the forward process in (8) results in M[f] being mirrored onto the peak locations $f_{s,k}$ in the measured data, and further distorted by H[f]. Therefore, templates of M[f] can in-principle be obtained from the data by windowing the data around $f_{s,k}$ and correcting for the distortion due to H[f]. Since $|H[f]|$ is of the form described in (12), these distortion-corrected templates of M[f] depend upon the choice of $\alpha$ and $\beta$ used to correct for the H[f]-distortion. The H[f]-distorted template of M[f] at location $f_{s,k}$ can be obtained from the measured data as:

$$M^{(k)}[f] = \frac{Y[f + f_{s,k}]}{Xinit[f_{s,k}]} = \frac{Y[f + f_{s,k}]}{Y[f_{s,k}]}, \quad (15)$$

for $|f| < f_b$ according to (11).

Figure 5:
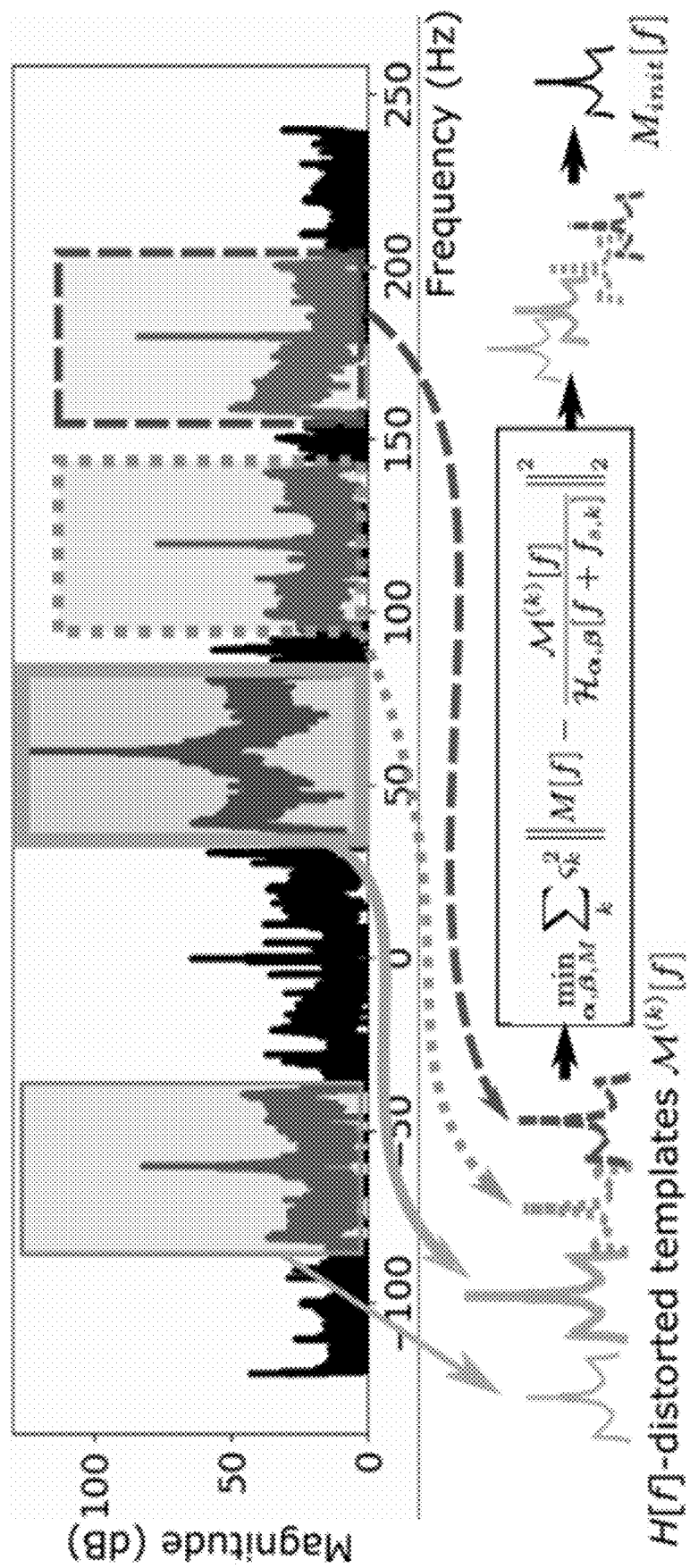
FIG. 5 is a schematic diagram of estimating the induction machine system response vector of the motor system and the modulation vector, according to embodiments of the present invention.

The schematic diagram of estimating the system response vector of the induction machine 200, and the modulation vector of the load $M_{init}$ is shown in FIG. 5.

Now, for the true value of $\alpha$ and $\beta$, the magnitudes of the distortion-corrected templates $$\left| \frac{M^{(k)}[f]}{H_{\alpha,\beta}[f + f_{s,k}]} \right|$$

in each small frequency window in FIG. 5 must be close to each other, as well as to the true value of $|M[f]|$. Therefore, the optimal value of $\alpha$, $\beta$, and the initial estimate of M[f] are computed via the following optimization problem:

$$\{\hat{\alpha}, \hat{\beta}, M_{init}\} = \mathrm{argmin}_{\alpha,\beta,M} \, L'(\alpha, \beta, M) \quad (16)$$

-continued $$= \text{argmin}_{\alpha,\beta,M} \sum_k \varsigma_k^2 \left\| M[f] - \frac{|M^{(k)}[f]|}{H_{\alpha,\beta}[f+f_{s,k}]} \right\|_2^2$$

where $\varsigma_k$ is the signal-to-noise ratio (SNR) at the $k^{th}$ harmonic. We adopt an alternating minimization scheme to solve this problem until convergence. For any feasible value of $\alpha$ and $\beta$, minimizing $L'(\alpha, \beta, M)$ with respect to M alone is straightforward, and the minimizer is given by $$\tilde{M}_{\alpha,\beta}[f] = \frac{1}{\sum_l \varsigma_l^2} \sum_l \varsigma_l^2 \frac{|M^{(l)}[f]|}{H_{\alpha,\beta}[f+f_{s,l}]} \quad (17)$$

Given the solution of $M_{init}$ in (17), the values of $\alpha$ and $\beta$ are then obtained by solving (16) using a black-box nonlinear least-squares solver.

Using the initialization of the optimization variables obtained, the estimates of the variables are obtained via the following optimization problem representing joint blind deconvolution and demodulation. Similar problems have been solved using alternating minimization approaches in the context of blind deconvolution.

These approaches alternately minimize the objective with respect to m and x iteratively. Although simple to describe, it has been shown that the alternating minimization approach is highly sensitive to initialization, and convergence can only be obtained under restrictive conditions. A proximal alternating linearized minimization (PALM) scheme addresses some of these issues by replacing the alternating minimization steps by proximal/projected gradient steps:

$$x_{k+1} = \text{prox}\left[\left(\frac{\lambda_x}{2}\right)\psi_x\right](x_k - \eta_x \nabla_x L(x_k, m_k)), \quad (18)$$

$$m_{k+1} = \text{proj}_{\{m|\text{supp}(m)=-[-f_m,f_m]\}}(m_k - \eta_m L(x_{k+1}, m_k)), \quad (19)$$

where for a function $\psi$: $c^N \to R$ and $v \in C^N$, the proximal operator is defined as $$\text{prox}[\psi](x) = \text{argmin}_w \psi(w) + \frac{1}{2}\|x - w\|_2^2 \quad (20)$$

and for a set S, $\text{proj}_S(m)$ is the projection of m onto S. In our approach, the proximal-gradient steps for x and m are interspersed with updates to h. Also, from (7), once $\hat{x}$ is recovered, the stator current without varying load can be obtained by $$\hat{s} = \hat{h} \otimes \hat{x}, \quad (21)$$

where $\hat{h}$ and $\hat{x}$ are outputs of the optimization problem defined in (13). The entire proposed procedure is summarized in FIG. 3. To examine our approach, we consider stator current data collected from a motor with eccentricity fault. The motor is operating at $f_s=60$ Hz with either a periodically varying load or a randomly varying load. In the case of the periodically varying load, two variation patterns are considered: a sinusoidal variation and a rectangular variation with a frequency of 2 Hz. In our approach, we set the half-bandwidth of m to be $f_m=26$ Hz. The sparsity weight $\sigma[f]$ is set to $e^{-\epsilon[f]}$, where $\epsilon[f]$ is the smooth envelope of log $|Y[f]|$. The signal-to-noise ratio (SNR) at peak location $f_{s,k}$ is computed as $$\varsigma_k = \frac{|y[f_{s,k}]|}{\eta},$$

with $\eta$ being the average noise level in a 1 Hz window on either side of the template support $[f_{s,k}-f_m, f_{s,k}+f_m]$. We compare our approach to the MV-beamforming method, which is effective at reducing the noise in the measured current signal, but unable to remove structured artifacts due to the varying load.

Figure 6A:
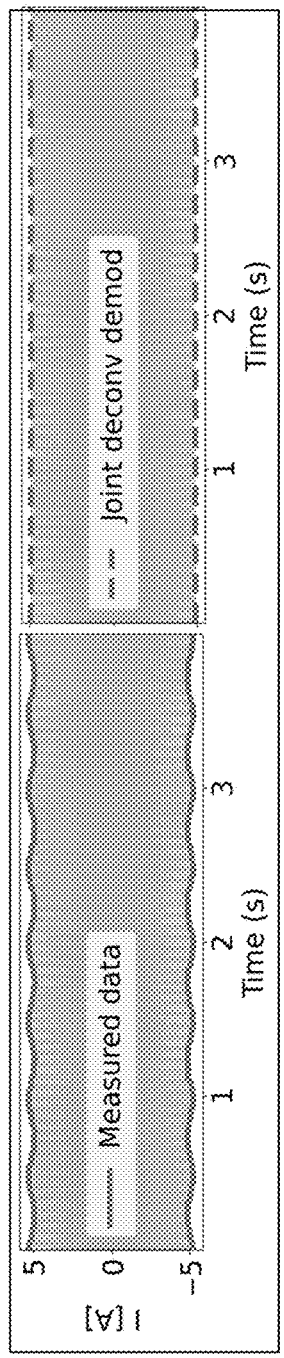
FIGS. 6A and 6B are exemplar plots of stator current spectrum at one varying load condition (sinusoidal modulation) using Fourier transform and proposed blind deconvolution-decomposition spectrum analysis method, respectively.
Figure 6B:
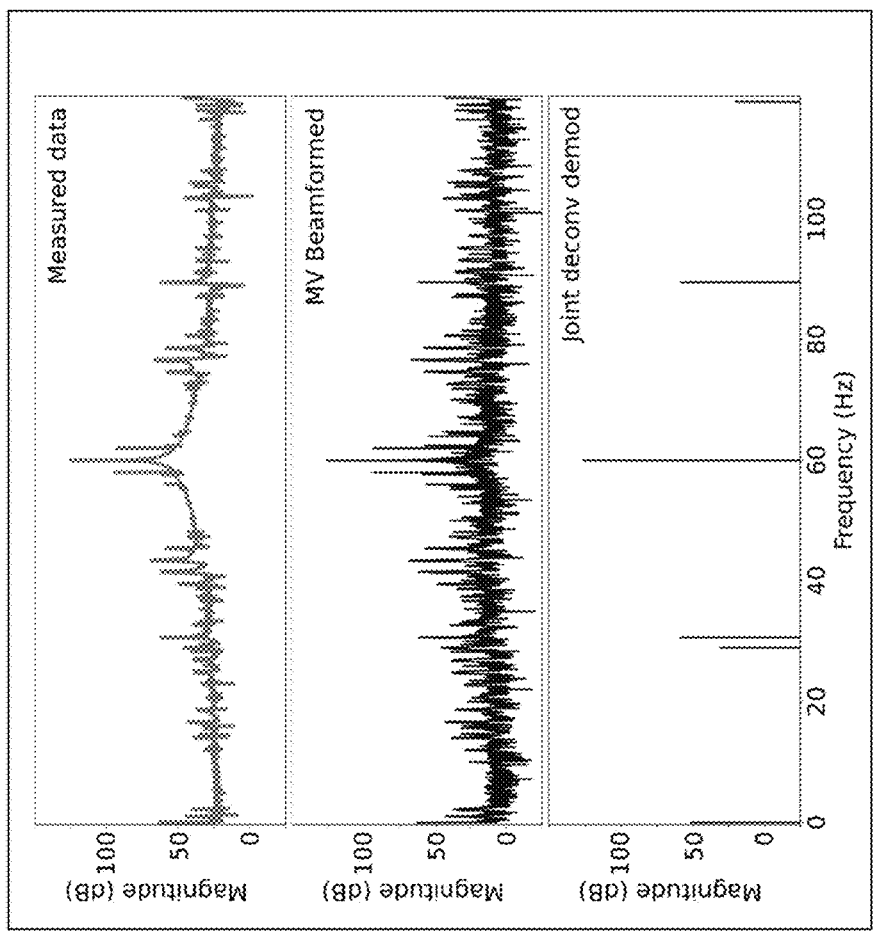

FIGS. 6A and 6B are exemplar plots of stator current spectrum at one varying load condition (sinusoidal modulation) using Fourier transform and proposed blind deconvolution-decomposition spectrum analysis method, respectively.

These plots show that as expected, MV beamforming is successful in denoising the signal, because it effectively destroys the noise by averaging over the random phase components of the noise, while adding structured periodic signal sections constructively. However, as expected, MV beamforming is unable to remove the artifacts due to load variation, since these artifacts are structured. The proposed approach is effective in removing the effects of load variation. The eccentricity fault signatures can be clearly seen around 30 Hz and 90 Hz when the corresponding rotor frequency $f_r=30$ Hz, which agrees with the MSCA-based fault detection model.

Figure 7A:
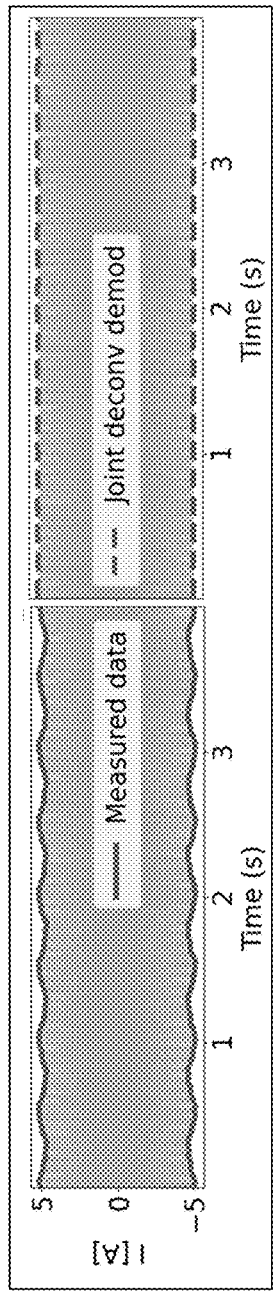
FIGS. 7A and 7B are exemplar plots of stator current spectrum at another varying load condition (rectangular modulation) using Fourier transform and proposed blind deconvolution-decomposition spectrum analysis method, respectively.
Figure 7B:
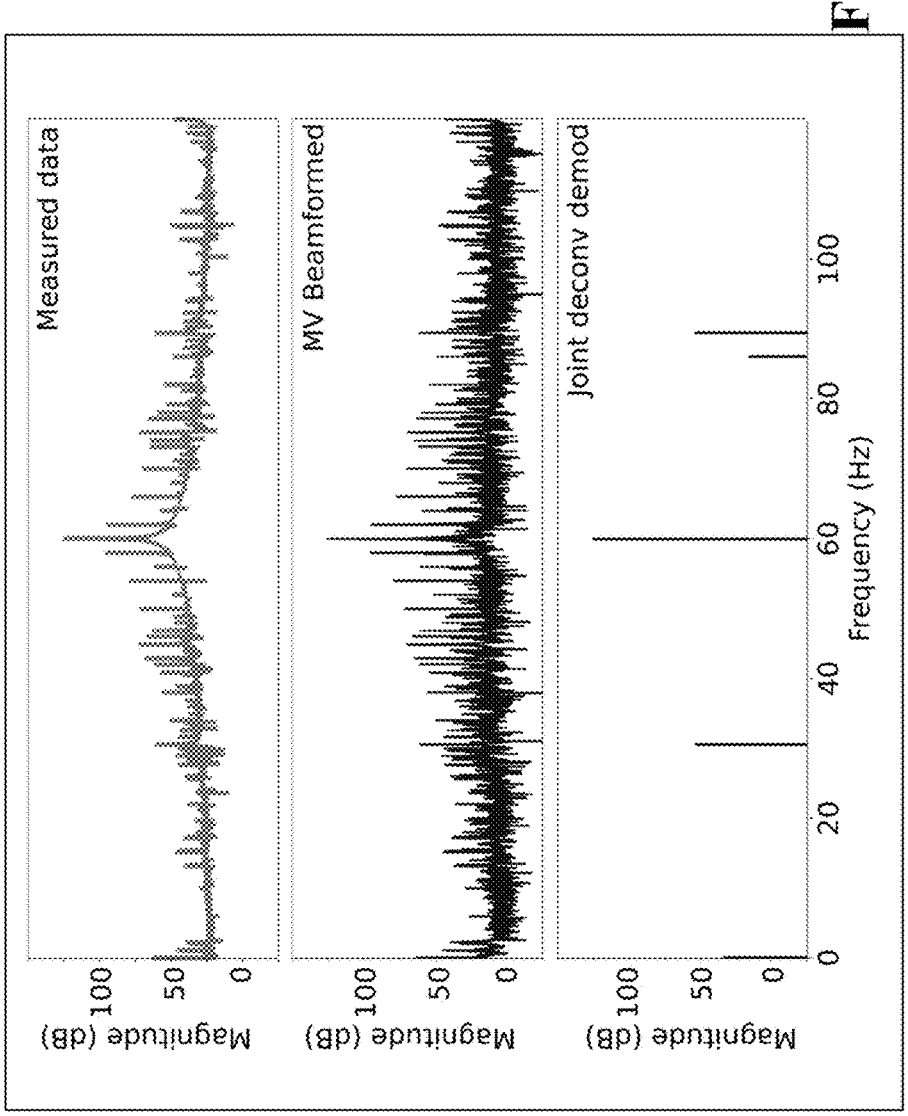

FIGS. 7A and 7B are exemplar plots of stator current spectrum at another varying load condition (rectangular modulation) using Fourier transform and proposed blind deconvolution-decomposition spectrum analysis method, respectively. Similarly, the proposed approach significantly reduced the impact of modulation due to the varying load.

Figure 8A:
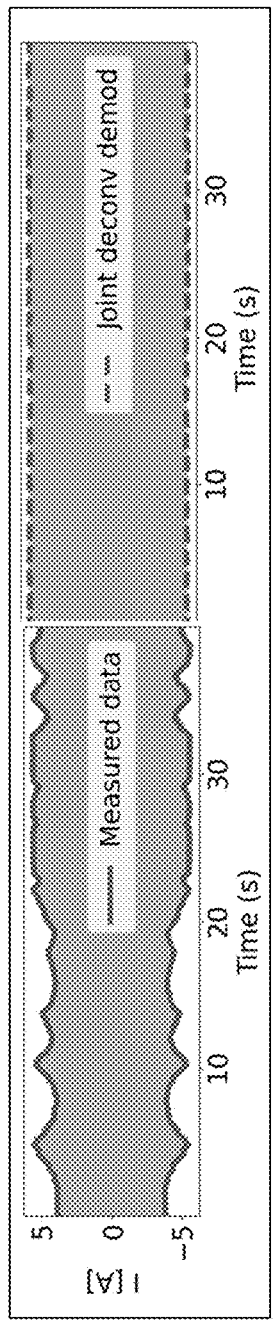
FIGS. 8A and 8B are exemplar plots of stator current spectrum at another varying load condition (random modulation) using Fourier transform and proposed blind deconvolution-decomposition spectrum analysis method, respectively.
Figure 8B:
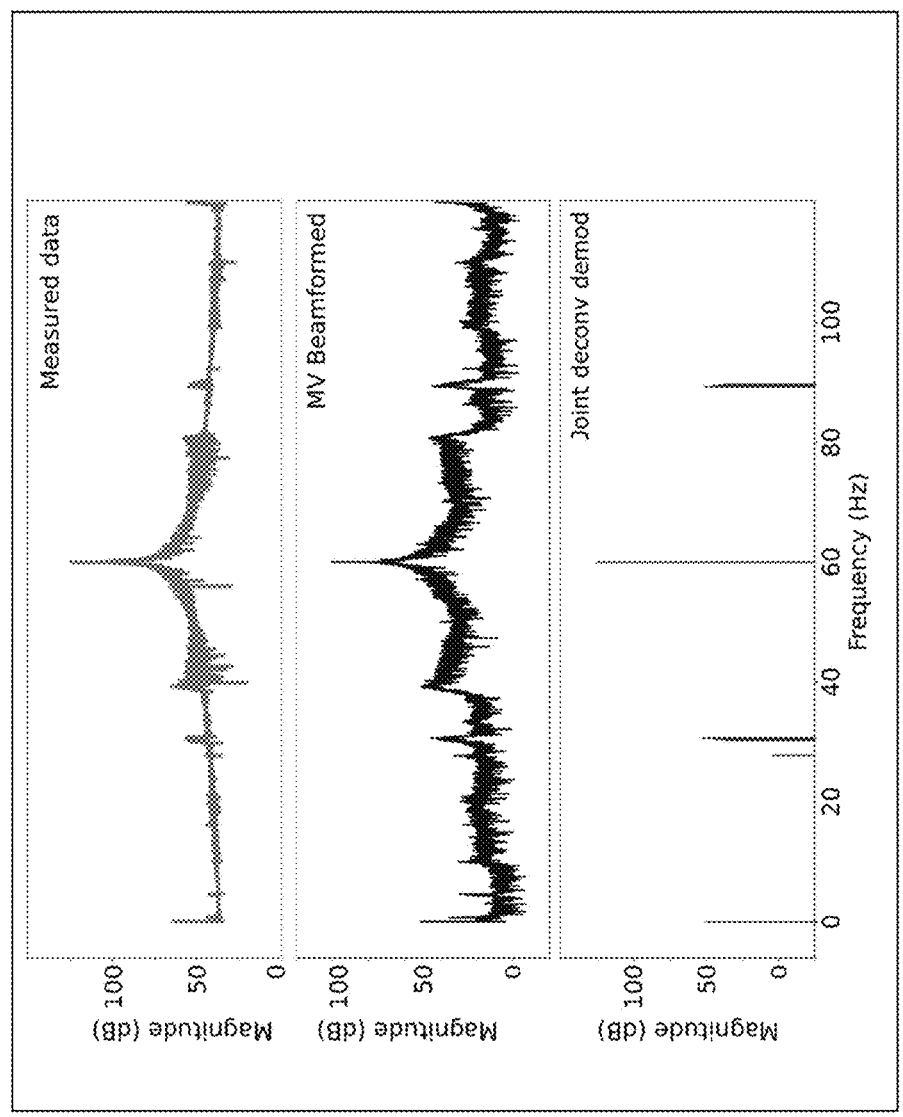

FIGS. 8A and 8B are exemplar plots of stator current spectrum at another varying load condition (random modulation) using Fourier transform and proposed blind deconvolution-decomposition spectrum analysis method, respectively. From the time-domain plot, the impacts of modulation are reduced by the proposed algorithm. In the frequency-domain plot, the proposed approach is effective in reducing the noise as well as the effects of the random convolution and modulation, and is able to retain the eccentricity fault signatures at around 30 Hz and 90 Hz respectively.

The above-described embodiments of the present invention can be implemented in any of numerous ways. For example, the embodiments may be implemented using hardware, software or a combination thereof. When implemented in software, the software code can be executed on any suitable processor or collection of processors, whether provided in a single computer or distributed among multiple computers. Such processors may be implemented as integrated circuits, with one or more processors in an integrated circuit component. Though, a processor may be implemented using circuitry in any suitable format.

Also, the embodiments of the invention may be embodied as a method, of which an example has been provided. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

Use of ordinal terms such as "first," "second," in the claims to modify a claim element does not by itself connote any priority, precedence, or order of one claim element over another or the temporal order in which acts of a method are performed, but are used merely as labels to distinguish one claim element having a certain name from another element having a same name (but for use of the ordinal term) to distinguish the claim elements.

Although the invention has been described by way of examples of preferred embodiments, it is to be understood that various other adaptations and modifications can be made within the spirit and scope of the invention.

Therefore, it is the object of the appended claims to cover all such variations and modifications as come within the true spirit and scope of the invention.

We claim:

1. A fault detection system for detecting faults of an induction motor operating at varying operating conditions indicative of varying load conditions, varying speed conditions or combination thereof, comprising:
   a sensor device connected to a power cable of the induction motor, wherein the sensor device is configured to measure a stator current of the induction motor under the varying operating conditions via the power cable;
   a memory configured to store a computer-implemented fault detection method;
   a signal processor configured to perform steps of the computer-implemented fault detection method, wherein the steps comprise:
   forming a stator current vector by sampling the measured stator current using on a sampling frequency according to time sequences;
   reducing noise of the stator current vector using a minimum-variance (MV) beam forming method;
   formulating a joint blind deconvolution-demodulation optimization problem based on the stator current vector of a steady operating condition, a response vector of the induction motor, a modulation vector of varying operating conditions, and a noise vector to satisfy the measured stator current vector with reduced noise;
   estimating the stator current vector of the steady operating condition, the response vector of the induction motor, the modulation vector of the varying operating conditions, and the noise vector by solving the joint blind deconvolution-demodulation optimization problem;
   extracting fault signatures from a clean stator current estimate vector, wherein the clean stator current estimate vector is generated by use of the estimated response vector and the estimated stator current vector;
   producing a control command to a controller of the induction motor if at least one of the fault signatures is greater than a threshold and controlling the induction motor by transmitting the control command that causes the controller to reduce an operation speed of the induction motor to a safety level, otherwise producing and transmitting a normal command indicative of the normal operations of the induction motor to the controller.

2. The fault detection system of claim 1, wherein the signal processor denoises the stator current using a minimum-variance (MV) beamforming method before the computing.

3. The fault detection system of claim 1, wherein the monitor of the controller displays the faulty operation sign in response to receiving the control signal.

4. The fault detection system of claim 1, wherein the control signal is indicative of a fault level and fault position caused in the induction motor.

5. The fault detection system of claim 1, wherein for the varying operating conditions, an electromagnetic torque is approximated by either the stator current or a rotor current of the induction motor.

6. The fault detection system of claim 5, wherein a half-bandwidth of a modulation signal related to the electromagnetic torque is approximately set a half of an operating frequency of the induction motor.

7. The fault detection system of claim 1, wherein the stator current vector of the steady operating condition is initialized as a linear combination of harmonics of an operating frequency of the induction motor.

8. The fault detection system of claim 1, wherein the fault signatures are determined by performing a spectrum analysis program on the clean stator current estimate vector.

9. The fault detection system of claim 1, wherein the solving further includes
   initializing the response vector and the modulation vector; and
   updating, iteratively, the stator current vector, the response vector, and the modulation vector until the updating reaches convergence.

10. The fault detection system of claim 1, wherein for the varying operating conditions, an electromagnetic torque is approximated by the stator current and a rotor current of the induction motor.

11. A computer-implemented method for detecting faults of an induction motor operating at varying operating conditions indicative of varying load conditions, varying speed conditions or combination thereof, comprising:
   measuring a stator current of the induction motor under the varying operating conditions via a current sensor connected to a power cable of the induction motor;
   forming a stator current vector by sampling the measured stator current using on a sampling frequency according to time sequences;
   reducing noise of the stator current vector using a minimum-variance (MV) beam forming method;
   formulating a joint blind deconvolution-demodulation optimization problem based on the stator current vector of a steady operating condition, a response vector of the induction motor, a modulation vector of varying operating conditions, and a noise vector to satisfy the measured stator current vector with reduced noise;
   estimating the stator current vector of the steady operating condition, the response vector of the induction motor, the modulation vector of the varying operating conditions, and the noise vector by solving the joint blind deconvolution-demodulation optimization problem;
   extracting fault signatures from a clean stator current estimate vector, wherein the clean stator current estimate vector is generated by use of the estimated response vector and the estimated stator current vector;
   producing a control command to a controller of the induction motor if at least one of the fault signatures is greater than a threshold and controlling the induction motor by transmitting the control command that causes the controller to reduce an operation speed of the induction motor to a safety level, otherwise producing and transmitting a normal command indicative of the normal operations of the induction motor to the controller.

12. The method of claim 11, further denoises the stator current using a minimum-variance (MV) beamforming method before the computing.

13. The method of claim 11, wherein the monitor of the controller displays a faulty operation sign on a display of the controller in response to receiving the control command.

14. The method of claim 11, wherein the control command is indicative of a fault level and fault position caused in the induction motor.

15. The method of claim 11, wherein for the varying operating conditions, an electromagnetic torque is approximated by either the stator current or a rotor current of the induction motor.

16. The method of claim 15, wherein a half-bandwidth of a modulation signal related to the electromagnetic torque is approximately set a half of an operating frequency of the induction motor.

17. The method of claim 11, wherein the stator current vector of the steady operating condition is initialized as a linear combination of harmonics of an operating frequency of the induction motor.

18. The method of claim 11, wherein the fault signatures are determined by performing a spectrum analysis program on the clean stator current estimate vector.

19. The method of claim 11, wherein the solving further includes
    initializing the response vector and the modulation vector; and
    updating, iteratively, the stator current vector, the response vector, and the modulation vector until the updating reaches convergence.

20. The method of claim 11, wherein for the varying operating conditions, an electromagnetic torque is approximated by the stator current and a rotor current of the induction motor.

* * * * *